(12) United States Patent
Kurrer et al.

(10) Patent No.: US 6,474,479 B2
(45) Date of Patent: *Nov. 5, 2002

(54) MODULE RACK HAVING AT LEAST ONE FRONT FACING GROOVE FOR MOUNTING COMPONENTS THERETO

(75) Inventors: Siegfried Kurrer, Nürnberg; Ernst Billenstein, Burgberheim; Werner Körber, Betzenstein, all of (DE)

(73) Assignee: Rittal Electronic Systems GmbH & Co. KG, Eckental (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/308,014

(22) Filed: Jul. 12, 1999

(65) Prior Publication Data

US 2002/0008073 A1 Jan. 24, 2002

(30) Foreign Application Priority Data

Nov. 11, 1996 (DE) .......................................... 296 19 481

(51) Int. Cl.⁷ ................................................. H05K 7/14
(52) U.S. Cl. ........................ 211/41.17; 211/26; 361/802
(58) Field of Search ............................... 211/41.17, 26, 211/182; 312/265.5, 265.2; 361/730, 727, 796, 797, 800, 802

(56) References Cited

U.S. PATENT DOCUMENTS

| | | | | |
|---|---|---|---|---|
| 4,007,516 A | * | 2/1977 | Coules ........................ 411/349 |
| 4,172,623 A | * | 10/1979 | Anderson .................... 312/244 |
| 4,201,303 A | * | 5/1980 | Smith ........................ 211/41.17 |
| 4,753,354 A | * | 6/1988 | Patterson et al. .............. 211/26 |
| 4,958,259 A | | 9/1990 | Berg et al. |
| 4,997,240 A | * | 3/1991 | Schmalzl et al. ......... 312/265.4 |
| 5,267,658 A | * | 12/1993 | Schwenk et al. .............. 211/26 |
| 5,313,370 A | * | 5/1994 | Schwenk et al. ............ 361/802 |
| 5,340,340 A | * | 8/1994 | Hastings et al. .............. 439/64 |
| 5,794,795 A | * | 8/1998 | Stemmons .................... 211/26 |
| 5,947,570 A | * | 9/1999 | Anderson et al. ......... 312/223.2 |

FOREIGN PATENT DOCUMENTS

| | | |
|---|---|---|
| DE | 1 591 484 | 2/1970 |
| DE | 88 13 844.5 | 3/1989 |
| DE | 91 02 071.9 | 6/1991 |
| DE | 40 34 772 | 2/1992 |
| DE | 41 28 449 | 7/1992 |
| EP | 0 262 450 | 4/1988 |
| EP | 0 338 339 | 10/1989 |
| FR | 1 578 231 | 8/1969 |

OTHER PUBLICATIONS

"Genormtes Gehäusesystem," G.I.I. Fachzeitschrift Für Das Laboratorium, vol. 16, No. 10, Oct. 1982, pp. 1194–1198.

* cited by examiner

Primary Examiner—Gregory J. Strimbu
(74) Attorney, Agent, or Firm—Pauley Petersen Kinne & Erickson

(57) ABSTRACT

A module rack has on its front at least one upper and one lower crossrail and at least one left and one right vertical corner profile strip. A vertical mounting groove is formed in at least one vertical corner profile strip. The vertical mounting groove faces away from the front of the module rack. Additional fastening capabilities may be provided on the front of the module rack. These additional fastening capabilities are used for external add-on parts such as a covering box, a handle, and cover panels. The module rack may be used for e.g., plug-in modules having electric circuits and components mounted on a printed circuit board.

3 Claims, 6 Drawing Sheets

US 6,474,479 B2

MODULE RACK HAVING AT LEAST ONE FRONT FACING GROOVE FOR MOUNTING COMPONENTS THERETO

BACKGROUND INFORMATION

As is conventional module racks are used for receiving so-called plug-in modules having electric circuits and components mounted on a printed circuit board. The circuit boards, as a rule in rather large numbers, are inserted standing vertically adjacent to one another into the module rack, with the assistance of snapped-in guide rails. To cover the front, each plug-in module has a front panel. The front panels of vertically mutually adjacent plug-in modules constitute a nearly continuous cover on the front of the module rack.

Such a configuration is described in, for example, French Patent FR 1 578 231.

European Patent No. 0 262 450 describes a multipurpose desktop chassis composed of two equal side parts and one upper and one lower part. In their inner parts, the side parts have T-grooves, arranged spaced uniformly apart from one another and extending continuously vertically. Moreover, corner pieces have T-grooves oriented toward one another. Into these, for example, a flat rear wall may be inserted. A comparable arrangement is also described in European Patent No. 0 338 339.

SUMMARY OF THE INVENTION

A module rack, according to the exemplary illustration in FIG. 1, has on its front 38 at least one upper and one lower crossrail 3, 4 and one left and one right vertical corner profile strip 5, 6. The crossrails 3, 4 and corner profile strips 5, 6 are joined to form a frame. As a rule, side wall plates 1, 2 are additionally applied to the corner profile strips 5, 6, for lateral coverage of inserted plug-in modules.

The crossrails 3, 4 have horizontal mounting grooves, as a rule facing outward toward the front 38 of the module rack. In the example in FIG. 1, such a mounting groove 29 is visible on the lower crossrail 4. Detention means, such as threaded rail strips, cage nuts and the like may be mounted in this groove. In these retention means, in turn, external fastening means, such as screws, may be retained. Components inserted in the module rack are fastenable to the front 38 via the fastening means. For example, plug-in modules inserted into the module rack are fastened to the module rack at their upper and lower edges via screws extending through their front panels into the horizontal mounting grooves of the upper and lower crossrails, using fastening means inserted into those grooves.

In practice, it is increasingly desirable to be able to mount further components, parts, covers and the like on the front of a module rack, as a function of a given application. This need gives rise to the problem that the horizontal mounting grooves in the upper and lower crossrails, extending across the entire breadth of a module rack, are covered by the ends of the front panels of inserted plug-in modules, and then are no longer accessible to receive further retention means.

An object of the present invention is to provide a module rack in which expanded fastening capabilities are available on the front of the module rack, particularly for external add-on parts.

DETAILED DESCRIPTION

Figure 1:
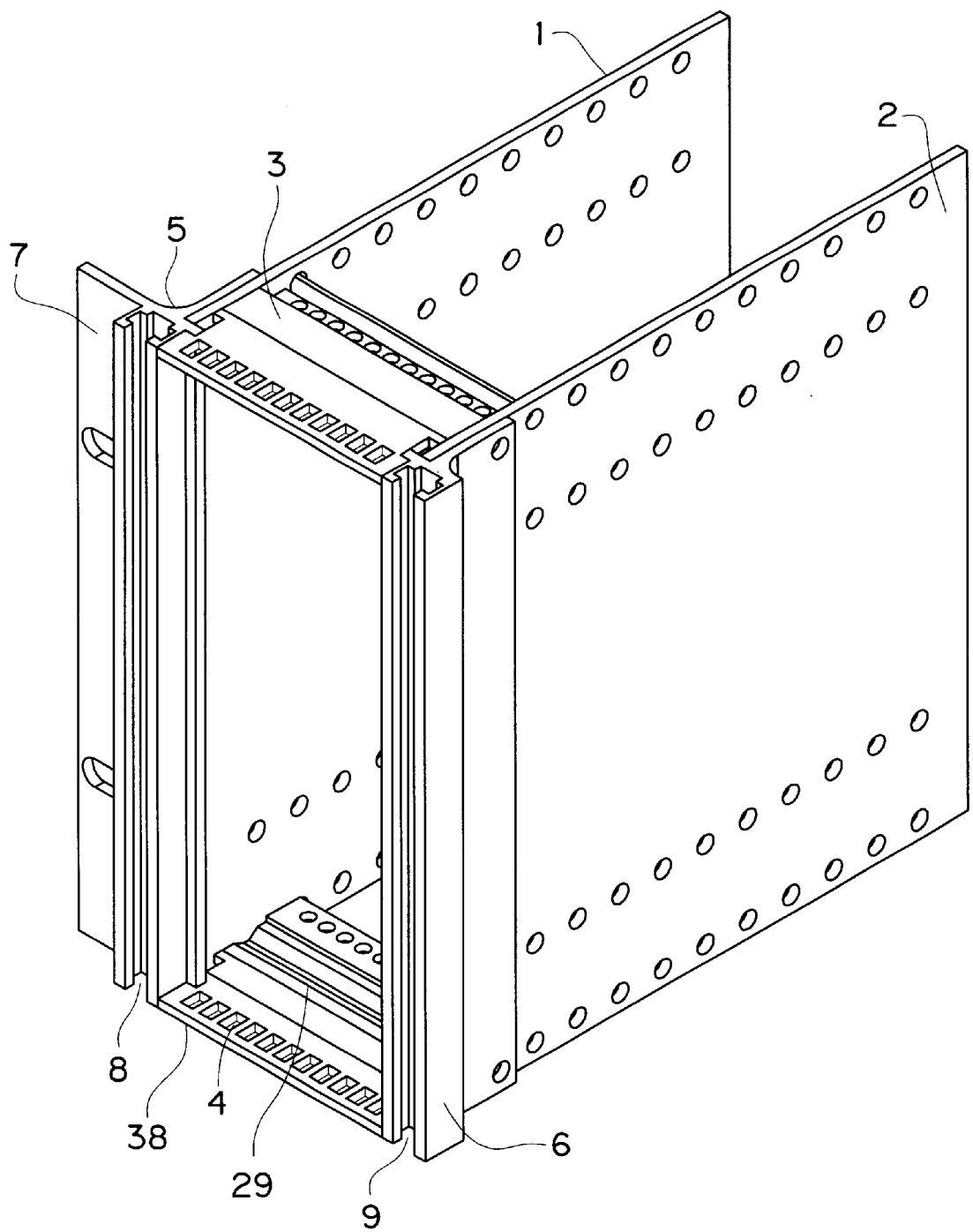
FIG. 1: shows the present invention, in which vertical mounting grooves are advantageously formed onto the two corner profile strips.

In the module rack shown in FIG. 1, the front 38 has at least one upper and one lower crossrail 3, 4, and one left and one right vertical corner profile strip 5, 6. The crossrails and corner profile strips are joined together and thus constitute the front 38 of the module rack shown in FIG. 1. Through this front, plug-in modules (not shown in FIG. 1 to permit easier comprehension), standing vertically, may be inserted into the module rack. According to the present invention, a vertical mounting groove is formed onto at least one of the vertical corner profile strips, preferably integrally in one piece and extends from approximately the upper crossrail to approximately the lower crossrail. In the example embodiment shown in FIG. 1, a pair of two vertical mounting grooves 8, 9 is formed onto two vertical corner profile strips 5 and 6, virtually opposite one another. This arrangement permits particularly stable retention, in particular of additional components, on the front of the module rack.

Figure 2:
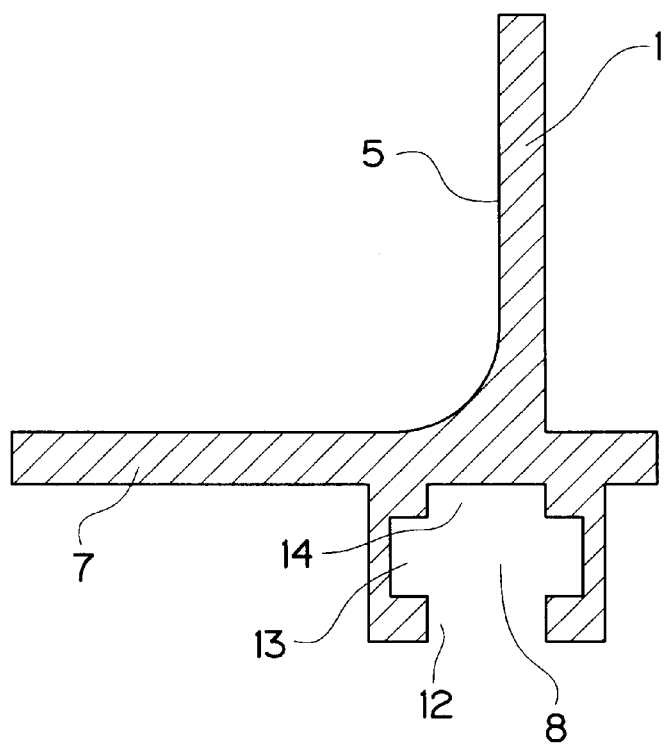
FIG. 2: shows an example of the cross section through the left corner profile strip of the module rack of FIG. 1.
Figure 3:
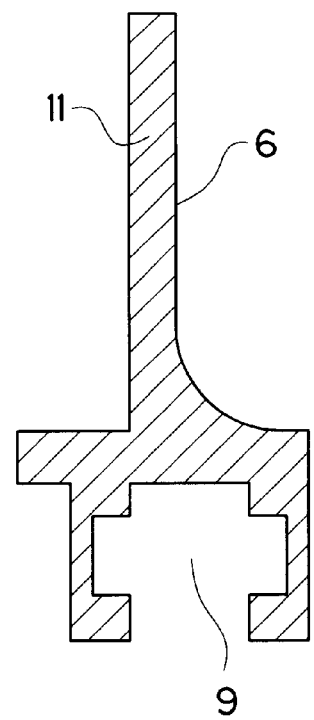
FIG. 3: shows an example of the cross section through the right corner profile strip of the module rack of FIG. 1.

An example embodiment of vertical mounting grooves according to the present invention is shown in cross section in FIGS. 2 and 3. FIG. 2 shows the vertical mounting groove 8 on left corner profile strip 5 from FIG. 1, and FIG. 3 shows the vertical mounting groove 9 on right corner profile strip 6 from FIG. 1. Here, corner profile strips 5, 6 each have a rear mounting strip 10, 11 extending rearwards into the interior of the module rack, and onto which side wall plates 1, 2 may be mounted as shown in FIG. 1. Left corner profile strip 5 additionally has a mounting flange 7 bent off at an angle of approximately 90 degrees from rear mounting strip 10. This may be used to mount the module rack, for example, in a switch cabinet. Vertical mounting grooves 8, 9, advantageously formed integrally in one piece onto corner profile strips 5, 6, each have a narrowed receiving slot 12 oriented toward the front 38 of the module rack, followed to the rear by an expanded retaining groove 13. In this retaining groove various retention means, such as threaded rail strips, cage nuts and the like, may be mounted. The latter, in turn, may retain external fastening means, such as screws. Add-on components applied to the front 38 of the module rack are fastenable using the fastening means. At the rear of expanded retaining groove 13, advantageously a narrowed take-up groove 14 is also arranged, into which longer threaded bolts may be taken up.

Figure 4:
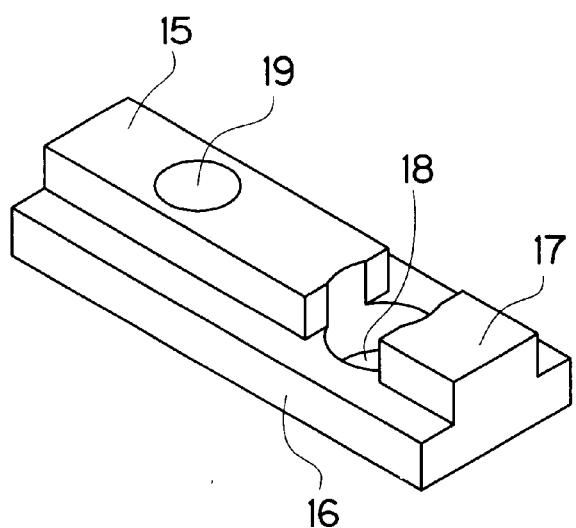
FIG. 4: shows an example of a retaining block insertable into a vertical mounting groove, for fastening external components.

Suitable fastening means in particular are retaining blocks, which are inserted into the vertical mounting groove and tightly fastenable there with the assistance, for example, of external screws. FIG. 4 shows an advantageous embodiment of a retaining block 16 for external parts. The base body 16 of the retaining block has a cross section shape that fits the vertical retaining groove. In the example in FIG. 4, the retaining block has a T-shaped cross section, such that base body 16 comes to lie in expanded retaining groove 13 and rear ridge 17 comes to lie in the narrowed receiving slot 12 of a vertical mounting groove. Retaining block 15 may be fixed within a vertical mounting groove, in any vertical position selected as a function of the application, with the assistance of a retaining screw which may be screwed into a threaded hole 19. Furthermore, a mounting opening 18 is present through which external components may be fastened to the retaining block via additional mounting screws.

Using the module rack shown in FIGS. 5 through 8 as an example, advantageous amplifications thereof with external components will be explained below, being fastened via mounting means which engage in at least one vertical mounting groove on a corner profile strip.

Figure 5:
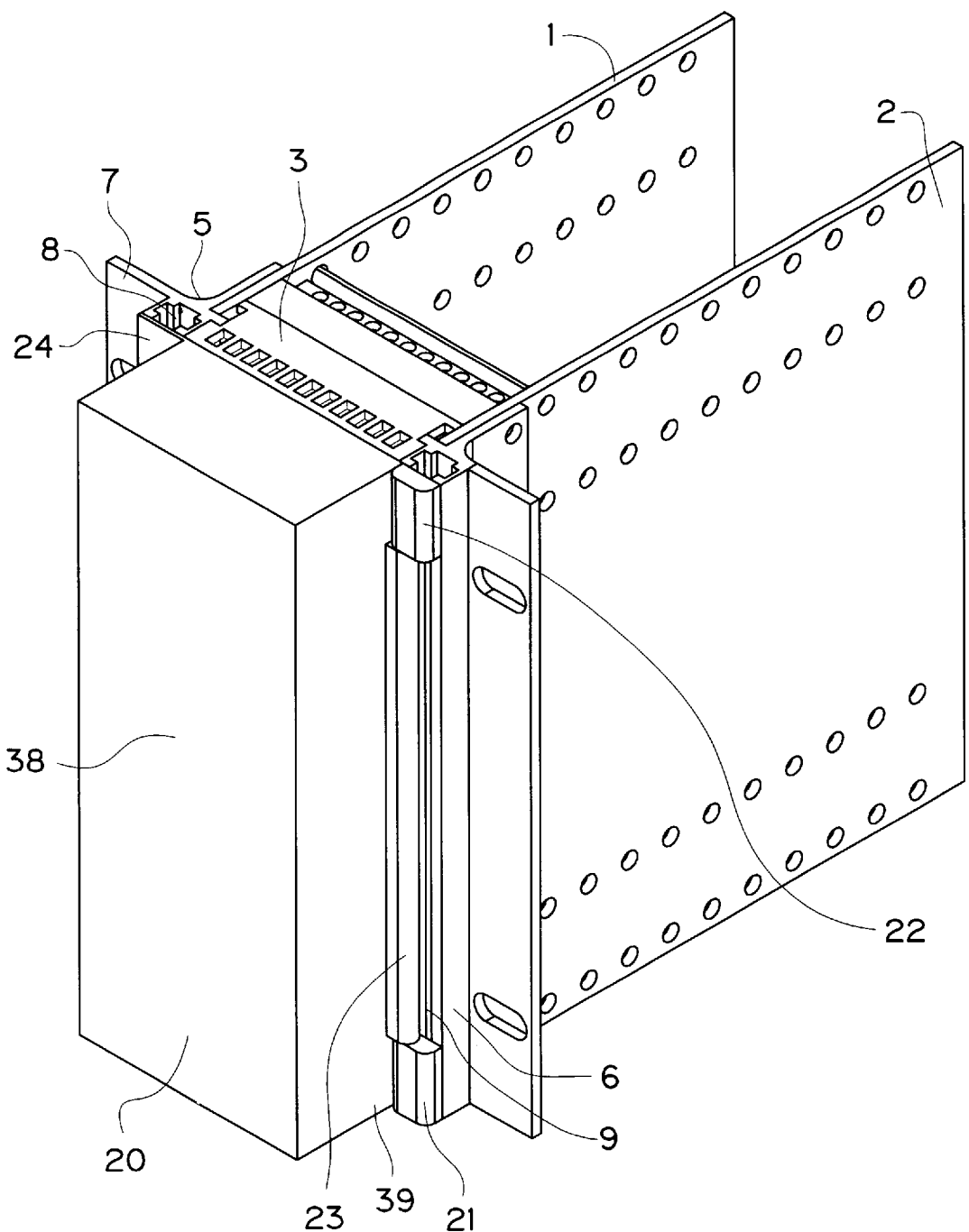
FIG. 5: shows an example of a module rack in accordance with the present invention, whose front is completely coverable by a covering box which is preferably pivotably mounted in the vertical mounting groove of a corner profile strip.

FIG. 5 shows a module rack across whose entire front 38 a covering box 20 extends and defines a volume extending only away from the module rack. This permits the front panels of underlying plug-in modules to be completely protected, for example against dirt, moisture, electromagnetic radiation and unauthorized access. This box is fastenable via retention means, such as screws, in one or both vertical mounting grooves 8, 9 of corner profile strips 5 or 6. In the configuration shown in FIG. 5, covering box 20 is pivotable. For this purpose covering box 20 has on one vertical side a retaining strip 23, which is pivotably mounted on an upper and lower hinge 21, 22. Hinges 21, 22 are mounted in vertical mounting groove 9 on right corner profile strip 6, preferably with the assistance of the retaining blocks 15 explained with reference to the example in FIG. 4. In the configuration shown in FIG. 5, vertical mounting groove 8 on left corner profile strip 5 is thus not needed to retain the cover 20. This unused vertical mounting groove 8 is thus advantageously covered by a vertical sealing edge 24 situated on the left side of the covering box.

Figure 6:
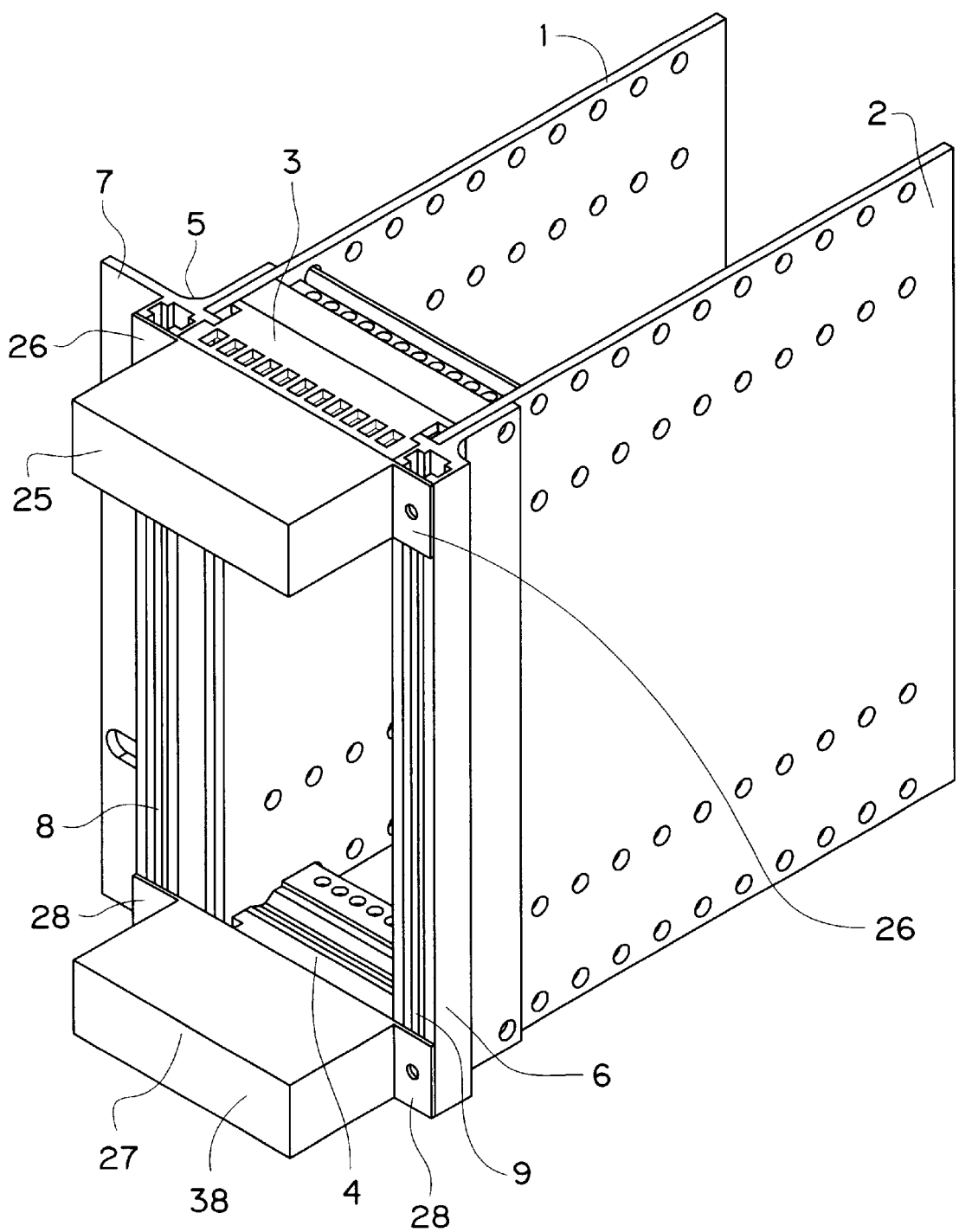
FIG. 6: shows an example of a module rack in accordance with the present invention, whose upper and lower crossrails are each covetable by a covering box retained in the vertical mounting grooves on the two corner profile strips.

The example in FIG. 6 shows a further configuration of a module rack designed according to the present invention. This rack has both an upper and a lower covering box 25, 27, respectively extending across upper and lower crossrails 3, 4 on the front 38. Upper and lower covering boxes 25, 27 are fastenable via mounting means which engage via flanges 26, 28 situated on both sides, into vertical mounting grooves 8, 9 of the two corner profile strips 5, 6. Upper and lower covering boxes 25, 27 may for example be used to secure levers and pull-type handles situated on the upper and lower ends of plug-in modules inserted into the module rack, in the manner of an overall closure against unintentional or unauthorized use.

Figure 7:
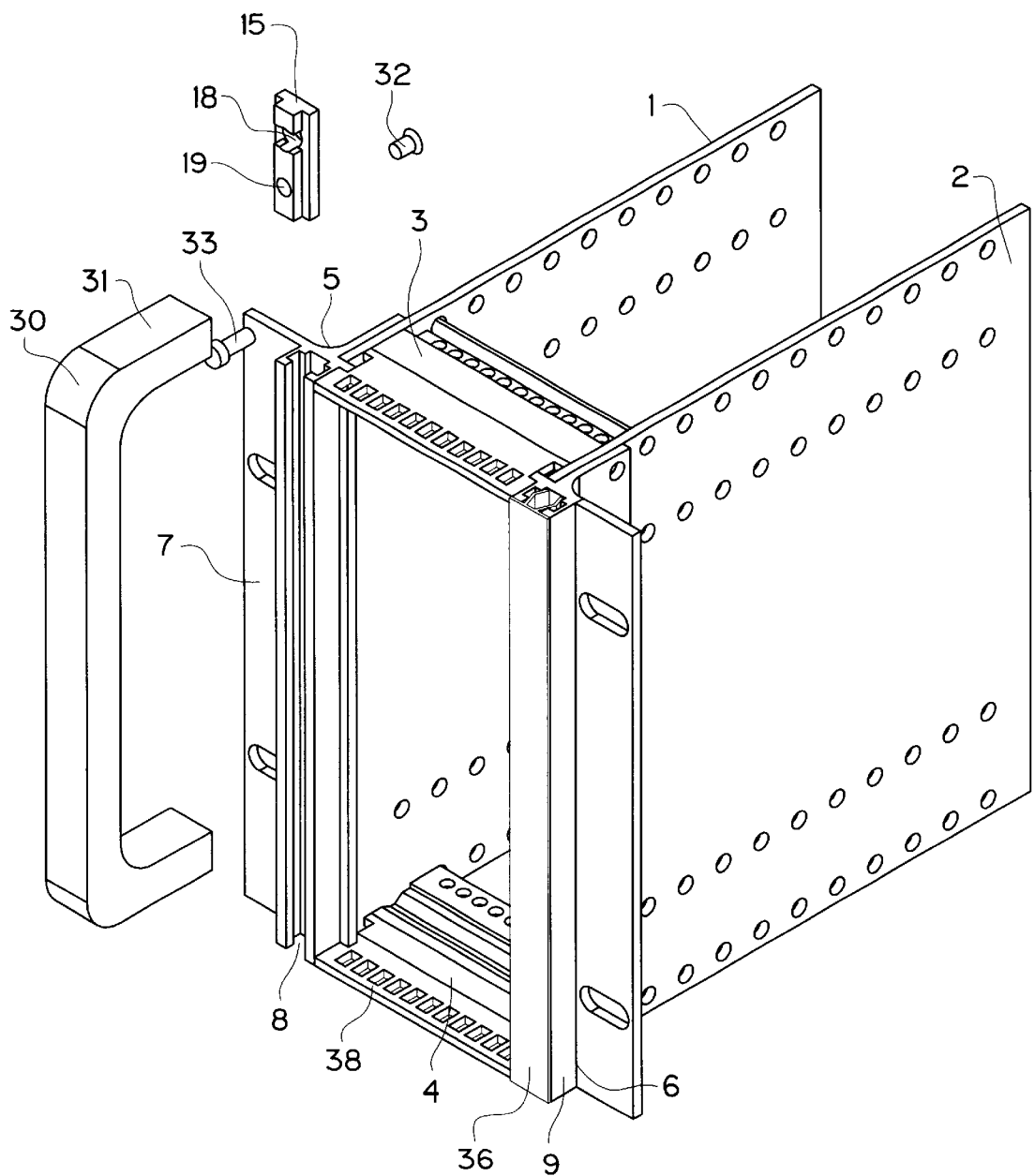
FIG. 7: shows an example of a module rack in accordance with the present invention, in which a loop-type handle is attached in the vertical mounting groove on the left corner profile strip via a retaining block.
Figure 8:
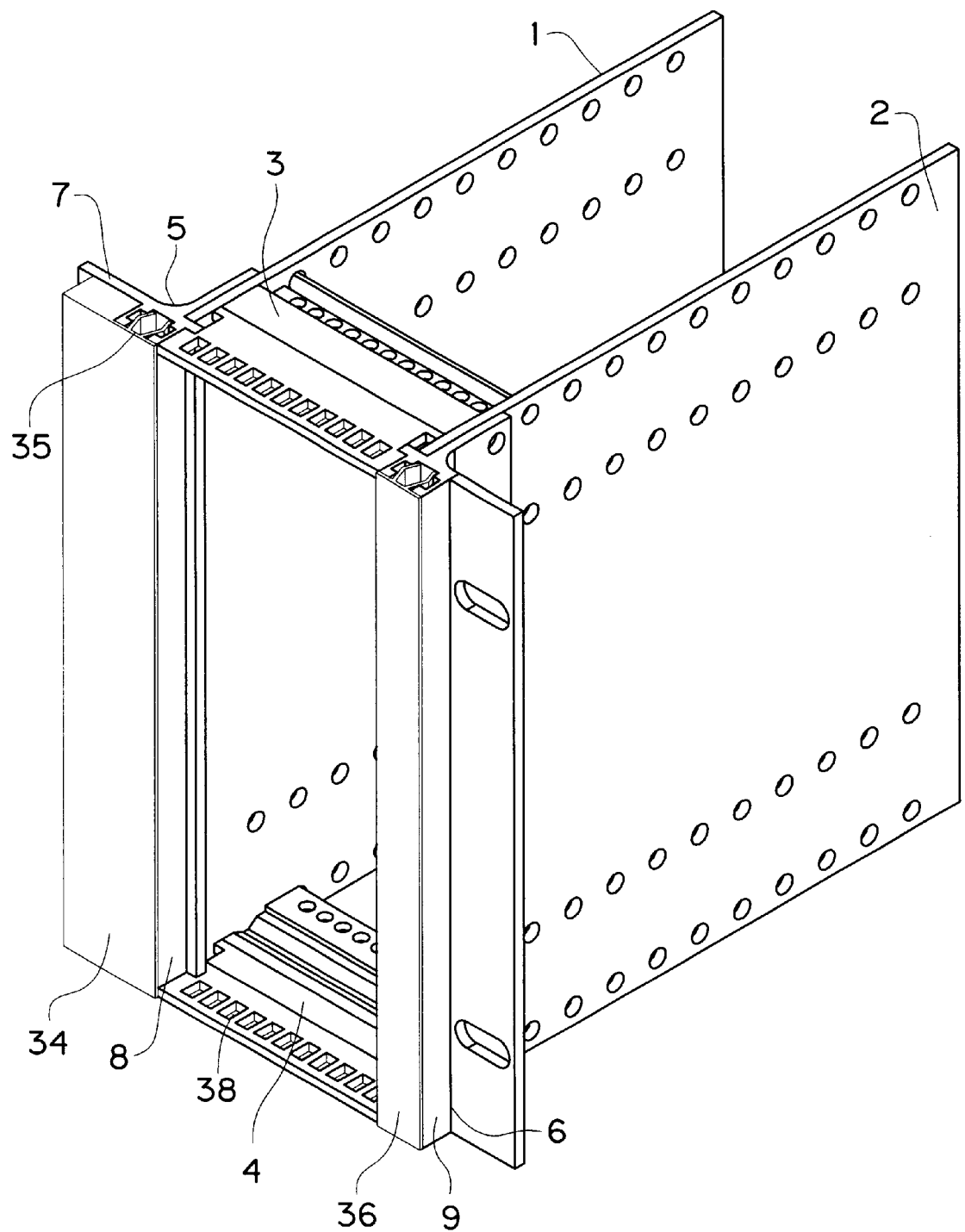
FIG. 8: shows an example of a module rack in accordance with the present invention, in which the vertical mounting grooves on the two corner profile strips are closable using preferably labelable cover panels.

In the example shown in FIG. 7, a loop-type handle 30 is applied in vertical mounting groove 8 on left corner profile strip 5 of the module rack. Fastening advantageously is provided via two retaining blocks, one each of which is joined to the upper and lower leg of loop-type handle 30 and then inserted from one side into vertical mounting groove 8. In the example in FIG. 7, the parts needed to mount the upper leg 31 of loop-type handle 30 are shown individually in the unassembled state for better comprehension. One screw 32, after engaging through opening 18, serves to retain retaining block 15 on the front end of upper leg 31. After the parts thus joined are inserted into vertical mounting groove 8, these parts may be tightly fastened in mounting groove 8 via a further screw 33, which engages in a threaded groove 19 in retaining block 15.

According to a further embodiment, shown in the example in FIG. 7, unused vertical mounting grooves on a module rack may be closed with a cover panel, at least temporarily. Thus,in FIG. 7, vertical mounting groove 9 is closed via a cover panel 36 tightly fastened into it. In the example shown in FIG. 8, both vertical mounting grooves 8, 9 on corner profile strips 5, 6 are closed with cover panels 34, 36. Here cover panels 34 and 36 each have on their backs spring-like claws 35 and 37, respectively, which may be tightly fastened in the respective vertical mounting groove 8 or 9. Advantageously, the cover panels (34, 36) may additionally have means for the application of labels. These means may, for example, be configured in the form of webs lying vertically one above the other, which are formed onto the front of a cover panel, and behind which labels may be inserted.

One advantage of the present invention is that with the vertical mounting grooves arranged at the sides of the front 38, a versatile fastening capability is made available for a wide variety of additional components, particularly mechanical components. These components may be used additionally, completely independently from the conventional fastening capabilities, particularly the horizontal mounting grooves on the upper and lower crossrails, and without adversely affecting the functionality of those fastening capabilities.

What is claimed is:

1. A module rack, comprising:

upper and lower crossrails;

left and right corner profile strips coupled to the upper and lower crossrails, the upper and lower crossrails and the left and right corner profile strips forming at least a portion of a front of the module rack, each of the left and right corner profile strips having a vertical mounting groove that faces away from the front of the module rack and extends from approximately said upper crossrail to approximately said lower crossrail; and a covering box extending across the front of the module rack, the covering box defining a volume extending only away from said module rack from approximately said left corner profile strip to approximately said right corner profile strip, said covering box being fastened to the vertical mounting groove of the left and right corner profile strips via respective left and right flanges that extend horizonally outwardly from the covering box.

2. A module rack, comprising:

upper and lower crossrails;

left and right corner profile strips coupled to the upper and lower crossrails, the upper and lower crossrails and the left and right corner profile strips forming at least a portion of a front of the module rack, each of the left and right corner profile strips having a vertical mounting groove that faces away from the front of the module rack; and a covering box extending across the front of the module rack, the covering box being fastenable to the vertical mounting groove, the covering box including at least one retaining strip on a vertical side of the covering box, the at least one retaining strip being pivotally mounted on at least one hinge, and the hinge being fastenable in the vertical mounting groove.

3. A module rack, comprising:

upper and lower crossrails;

left and right corner profile strips coupled to the upper and lower crossrails, the upper and lower crossrails and the left and right corner profile strips forming at least a portion of a front of the module rack, each of the left and right corner profile strips having a vertical mounting groove that faces away from the front of the module rack and extends from approximately said upper crossrail to approximately said lower crossrail; and a covering box extending across one of the upper and lower crossrails on the front of the module rack, the covering box defining a volume extending only away from said module rack from approximately said left corner profile strip to approximately said right corner profile strip, said covering box being fastened to the vertical mounting groove of the left and right corner profile strips via respective left and right flanges that extend horizontally outwardly from the covering box.

* * * * *